(12) United States Patent
Nonaka et al.

(10) Patent No.: US 11,370,069 B2
(45) Date of Patent: Jun. 28, 2022

(54) FLUX COMPOSITION, SOLDER PASTE COMPOSITION, AND SOLDER JOINT

(71) Applicant: SENJU METAL INDUSTRY CO., LTD., Tokyo (JP)

(72) Inventors: Tomoko Nonaka, Tokyo (JP); Tomoko Nagai, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 16/605,459

(22) PCT Filed: Apr. 12, 2018

(86) PCT No.: PCT/JP2018/015366
§ 371 (c)(1),
(2) Date: Oct. 15, 2019

(87) PCT Pub. No.: WO2018/193960
PCT Pub. Date: Oct. 25, 2018

(65) Prior Publication Data
US 2020/0353574 A1   Nov. 12, 2020

(30) Foreign Application Priority Data
Apr. 17, 2017   (JP) .............................. JP2017-081369

(51) Int. Cl.
| | | |
|---|---|---|
| B23K 35/26 | (2006.01) | |
| B23K 35/362 | (2006.01) | |
| C22C 13/00 | (2006.01) | |
| H05K 3/34 | (2006.01) | |

(52) U.S. Cl.
CPC .......... *B23K 35/362* (2013.01); *B23K 35/262* (2013.01); *C22C 13/00* (2013.01); *H05K 3/3489* (2013.01)

(58) Field of Classification Search
CPC .............................. B23K 35/362; C22C 13/00
USPC ........................................................ 148/23
See application file for complete search history.

(56) References Cited

U.S. PATENT DOCUMENTS

| | | | | |
|---|---|---|---|---|
| 6,060,137 | A * | 5/2000 | Akao ...................... | B32B 27/08 428/35.2 |
| 2016/0184936 | A1 | 6/2016 | Mori et al. | |

FOREIGN PATENT DOCUMENTS

| | | |
|---|---|---|
| JP | H04371391 A | 12/1992 |
| JP | H0592295 A | 4/1993 |
| JP | 05185283 A * | 7/1993 |
| JP | H05-185283 A | 7/1993 |
| JP | H06-49272 A | 2/1994 |
| JP | 2007-015945 A | 1/2007 |
| JP | 2007069260 A | 3/2007 |
| JP | 4447798 B2 | 4/2010 |
| WO | WO-2015/022719 A1 | 2/2015 |

OTHER PUBLICATIONS

International Search Report (in English and Japanese) issued in PCT/JP2018/015366, dated Jul. 17, 2018; ISA/JP.
Decision to Grant a Patent issued in JP-6531958-B2 (Application No. JP-2017-081369), dated Apr. 25, 2019 (with English Translation).
Notice of Reasons for Refusal issued in Japanese Patent Application No. 2017-081369 (Patent No. JP-6531958-B2) drafted Mar. 11, 2019 and dated Mar. 13, 2019, along with an English Translation.
Extended European Search Report dated Nov. 29, 2019 issued in corresponding European Patent Application No. 18787557.0.

* cited by examiner

*Primary Examiner* — Weiping Zhu
(74) *Attorney, Agent, or Firm* — Harness, Dickey & Pierce, P.L.C.

(57) ABSTRACT

The object of the present invention is to provide a flux composition and a solder paste composition in which scattering of flux is suppressed.
A flux composition comprising an anti-scattering agent represented by formula (1) below,

[Chemical Formula 1]

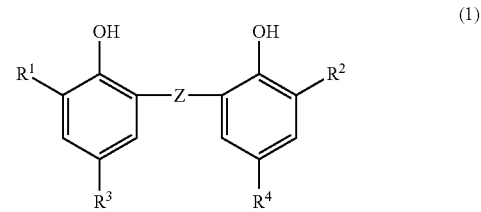

(1)

wherein
  Z is optionally substituted alkylene,
  $R^1$ and $R^2$ are each independently optionally substituted alkyl, optionally substituted aralkyl, optionally substituted aryl, optionally substituted heteroaryl, optionally substituted cycloalkyl, or optionally substituted heterocycloalkyl,
  $R^3$ and $R^4$ are each independently optionally substituted alkyl.

3 Claims, 1 Drawing Sheet

FLUX COMPOSITION, SOLDER PASTE COMPOSITION, AND SOLDER JOINT

CROSS-REFERENCE TO RELATED APPLICATIONS

This application is the U.S. National Phase Application under 35 U.S.C. 371 of International Application No. PCT/JP2018/015366 filed on Apr. 12, 2018, which claims the benefit of priority from Japanese Patent Application No. 2017-081369, filed on Apr. 17, 2017. The entire disclosures of both of the above applications are incorporated herein by reference.

TECHNICAL FIELD

The present invention relates to a flux composition, a solder paste composition, and a solder joint.

BACKGROUND ART

For joining and assembling of electronic components together with a substrate of an electronic equipment, soldering using a solder paste composition is most advantageous in terms of cost and reliability, and is most commonly conducted. A solder paste composition is a mixture obtained by kneading a solder powder and a flux composition which is composed of other components than solder powder such as rosin, activator, thixotropic agent, and solvent to form a paste.

When applying a solder paste composition to a substrate, scattering of flux on the substrate leads to pollution of neighboring electronic components, and thus it is required to suppress scattering of flux.

In addition, applying of a solder paste composition to a substrate is conducted by, for example, screen printing using a metal mask. Thus, in order to secure printability of a solder paste composition, a solder paste composition is required to have suitable viscosity. However, particular types of solder paste compositions have inferior storage stability, and in some cases the viscosity of the solder paste compositions could increase over time.

As the conventional solder paste compositions, for example, a solder paste composition containing a lead-free solder powder, a rosin-based resin, an activator, a solvent, and an anti-oxidant consisting of a hindered phenol-based compound having a molecular weight of at least 500 has been proposed (PTL 1).

However, the applicants investigated the solder paste composition described in PTL 1, and as a result, it was found that scattering of flux occurred.

Therefore, a flux composition and a solder paste composition are desired in which scattering of flux is suppressed.

CITATION LIST

Patent Literature

PTL 1: Japanese Patent No. 4447798

SUMMARY OF INVENTION

Technical Problem

The object of the present invention is to provide a solder paste composition and a flux composition contained therein in which scattering of flux is suppressed.

Furthermore, the object of the present invention is also to provide a solder paste composition and a flux composition contained therein in which, in addition to scattering of flux, a viscosity increase over time is also suppressed.

Solution to Problem

The present inventors engaged in a diligent study to achieve the above object, and consequently completed the present invention by discovering that the flux composition and the solder paste composition comprising a particular anti-scattering agent could suppress scattering of flux when the solder paste composition was used and a viscosity increase over time. Specific embodiments of the present invention are as follows.

[1]
A flux composition comprising an anti-scattering agent represented by formula (1) below,

[Chemical Formula 1]

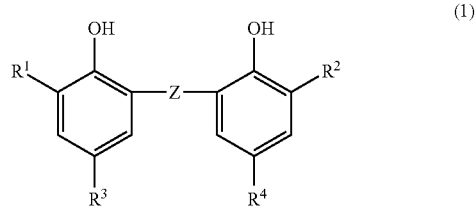

wherein
Z is optionally substituted alkylene,
$R^1$ and $R^2$ are each independently optionally substituted alkyl, optionally substituted aralkyl, optionally substituted aryl, optionally substituted heteroaryl, optionally substituted cycloalkyl, or optionally substituted heterocycloalkyl, and
$R^3$ and $R^4$ are each independently optionally substituted alkyl.

[2]
The flux composition according to [1], wherein
Z is $C_1$-$C_6$ alkylene,
$R^1$ and $R^2$ are each independently $C_1$-$C_6$ alkyl or alkylcycloalkyl, and
$R^3$ and $R^4$ are each independently $C_1$-$C_6$ alkyl.

[3]
The flux composition according to [1] or [2], wherein the anti-scattering agent is 2,2'-methylenebis[6-(1-methylcyclohexyl)-p-cresol].

[4]
The flux composition according to any one of [1] to [3], wherein the percentage by weight of the anti-scattering agent is 0.5 to 10 wt. %.

[5]
The flux composition according to any one of [1] to [4], further comprising a rosin, an activator, a thixotropic agent, and a solvent.

[6]
A solder paste composition comprising the flux composition according to any one of [1] to [5] and a solder powder.

[7]
A solder joint formed by the solder paste composition according to [6].

Advantageous Effects of Invention

The flux composition and the solder paste composition of the present invention can suppress scattering of flux.

Furthermore, the flux composition and the solder paste composition of the present invention can suppress scattering of flux and can suppress a viscosity increase over time.

DESCRIPTION OF EMBODIMENTS

Figure 1:
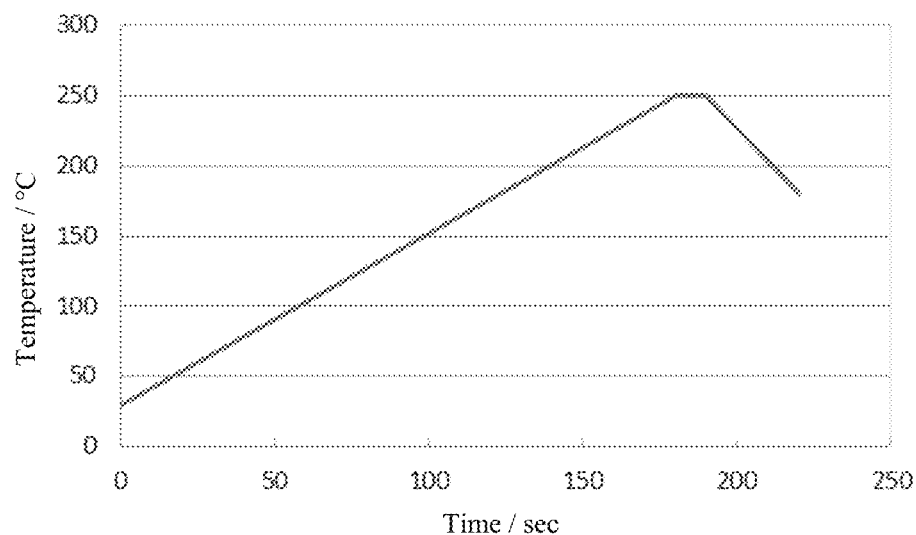
FIG. 1 is a graph illustrating a schematic diagram of a reflow profile in an evaluation test of scattering.

The flux composition and the solder paste composition of the present invention will be described in the following.

"Flux composition" or "flux" in the present invention means entire components other than a solder powder in a solder paste composition. In the solder paste composition of the present invention, a weight ratio of the solder powder to the flux composition (solder powder:flux composition) is preferably from 80:20 to 90:10, more preferably from 85:15 to 90:10.

The flux composition of the present invention comprises an anti-scattering agent represented by above formula (1).

In the anti-scattering agent represented by formula (1), Z is optionally substituted alkylene, preferably $C_1$-$C_6$ alkylene, more preferably $C_1$-$C_3$ alkylene, most preferably methylene. $R^1$ and $R^2$ are each independently optionally substituted alkyl, optionally substituted aralkyl, optionally substituted aryl, optionally substituted heteroaryl, optionally substituted cycloalkyl, or optionally substituted heterocycloalkyl, preferably $C_1$-$C_6$ alkyl or alkylcycloalkyl, more preferably tert-butyl or 1-methylcyclohexyl, most preferably 1-methylcyclohexyl. $R^3$ and $R^4$ are each independently $C_1$-$C_6$ alkyl, preferably $C_1$-$C_3$ alkyl, more preferably ethyl or methyl, most preferably methyl. As the anti-scattering agent represented by formula (1), for example, 2,2'-methylenebis (4-methyl-6-tert-butylphenol), 2,2'-methylenebis(4-ethyl-6-tert-butylphenol), 2,2'-methylenebis[6-(1-methylcyclohexyl)-p-cresol] can be used, and in particular, 2,2'-methylenebis[6-(1-methylcyclohexyl)-p-cresol] is preferably used in terms of suppression of scattering of flux. The percentage by weight of the anti-scattering agent represented by above formula (1) in the flux composition of the present invention is preferably 0.5 to 10 wt. %, more preferably 1 to 6 wt. %.

The solder paste composition of the present invention comprises a solder powder.

As the alloy composition of the solder powder in the present invention, Sn—Ag based alloy, Sn—Cu based alloy, Sn—Ag—Cu based alloy, Sn—In based alloy, Sn—Bi based alloy, Sn—Sb based alloy, and the above alloys to which at least one of Ag, Cu, Ni, Co, P, Ge, Sb, In, Bi, Zn etc. are added can be used.

The solder paste composition of the present invention can further comprise a rosin, an activator, a thixotropic agent, and a solvent in addition to a solder powder and an anti-scattering agent represented by formula (1).

As a rosin, a hydrogenated rosin, an acid-modified rosin, a polymerized rosin, a rosin ester etc. can be used. The percentage by weight of a rosin in the flux composition of the present invention is preferably 10 to 70 wt. %, more preferably 30 to 60 wt. %.

Examples of activators include an organic acid, a salt of amine halogenated hydroacid, and an organic halogen compound. These activators are preferably water-soluble or alcohol-soluble. Specific examples of activators are as follows. Examples of organic acids include stearic acid, succinic acid, glutaric acid, adipic acid, azelaic acid, sebacic acid, dimer acid etc. Examples of amine compounds of a salt of amine halogenated hydroacid include ethylamine, diethylamine, dibutylamine, tributylamine, isopropylamine, diphenylguanidine, cyclohexylamine, aniline etc.; examples of halogenated hydroacids include hydrochloric acid, hydrobromic acid, hydroiodic acid etc. Examples of organic halogen compounds include 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 2,3-dibromo-1,4-butanediol, 2,3-dibromo-2-butene-1,4-diol etc. The percentage by weight of the activator in the flux composition of the present invention is preferably 0.1 to 50 wt. %, more preferably 1 to 40 wt. %, most preferably 5 to 30 wt. %.

As a thixotropic agent, higher fatty acid amide, higher fatty acid ester, hydrogenated castor oil etc. can be used. The percentage by weight of the thixotropic agent in the flux composition of the present invention is preferably 1 to 15 wt. %.

A solvent is selected from commonly known glycol ether-based compounds. Specific examples of solvents include diethylene glycol monobutyl ether, diethylene glycol dibutyl ether, diethylene glycol monohexyl ether, diethylene glycol mono-2-ethylhexyl ether, ethylene glycol monophenyl ether, diethylene glycol monophenyl ether, dipropylene glycol monobutyl ether, tripropylene glycol monobutyl ether etc. The percentage by weight of the solvent in the flux composition of the present invention is preferably 10 to 50 wt. %, more preferably 20 to 40 wt. %.

In the present invention, the solder paste composition is produced by preparing the flux composition comprising the anti-scattering agent represented by formula (1), rosin, activator, thixotropic agent, and solvent and then kneading the obtained flux composition and a solder powder.

The solder paste composition of the present invention thus prepared can be applied to a portion to be soldered of a circuit board having a microstructure in an electronic equipment, for example, by a printing method using a metal mask, a discharging method using a dispenser, or a transferring method by a transfer pin, and then can be subjected to reflow.

In the present invention, soldering temperature (reflow temperature) is set at a temperature that is 20 to 30° C. higher than the melting point of the solder powder.

In the present invention, a solder joint can be formed by using the above-mentioned solder paste composition.

The present invention will be described hereinafter more specifically using examples, however the present invention is not limited to the contents described in the examples.

EXAMPLES

The flux composition of Examples 1 to 4 and Comparative Examples 1 to 4 were prepared to have each composition listed in table 1 below. 11 wt. % of the flux composition of each of Examples 1 to 4 and Comparative Examples 1 to 4 and 89 wt. % of powder of a solder alloy were mixed to obtain a solder paste composition. The composition of a solder alloy was Sn-3Ag-0.5Cu (each numeric value represents wt. %). Numeric values of each component listed in table 1 represent wt. % of each component in the flux composition.

TABLE 1

|  | Example 1 | Example 2 | Example 3 | Example 4 | Comparative Example 1 | Comparative Example 2 | Comparative Example 3 | Comparative Example 4 |
| --- | --- | --- | --- | --- | --- | --- | --- | --- |
| Acid-modified rosin | 45 | 45 | 45 | 43.5 | 45 | 38.5 | 45 | 45 |
| Sebacic acid | 7 | 7 | 7 | 7 | 7 | 7 | 7 | 7 |
| 2,3-Dibromo-2-butene-1,4-diol | 2 | 2 | 2 | 2 | 2 | 2 | 2 | 2 |
| 2,2'-Methylenebis[6-(1-methylcyclohexyl)-p-cresol] | 0.5 | 3.5 | 6 | 10 | 0.3 | 15 |  |  |
| Triethylene glycol-bis[3-(3-t-butyl-5-methyl-4-hydroxyphenyl) propionate] |  |  |  |  |  |  | 3.5 |  |
| Hydrogenated castor oil | 7.5 | 7.5 | 7.5 | 7.5 | 7.5 | 7.5 | 7.5 | 7.5 |
| Solvent | 38 | 35 | 32.5 | 30 | 38.2 | 30 | 35 | 38.5 |
| Total | 100 | 100 | 100 | 100 | 100 | 100 | 100 | 100 |

(Evaluation)

(1) Evaluation of scattering of flux, (2) evaluation of viscosity change and (3) evaluation of solderability were conducted as follows using the solder paste composition of each of Examples 1 to 4 and Comparative Examples 1 to 4. The results of the evaluations were shown in Table 3.

(1) Evaluation of Scattering of Flux

The solder paste compositions of Examples 1 to 4 and Comparative Examples 1 to 4 were printed respectively on copper-clad laminated sheets (size: 105 mm×105 mm, thickness: 1.0 mm) using a metal mask (mask thickness: 0.1 mm, printing pattern: one pattern of 6.5 mmϕ), then the sheets were subjected to reflow using the profile shown in FIG. 1 in which scattering tends to occur (rate of temperature increase: 1.3° C./sec, peak temperature: 250° C.) to produce test substrates. The test substrates were observed, and the number of generated scattering of flux throughout the test substrate was measured. For each solder paste composition of Examples 1 to 4 and Comparative Examples 1 to 4, the test was conducted 3 times, and the average number of generated scattering of flux was calculated and used as evaluation of scattering of flux according to the criteria shown in Table 2 below.

TABLE 2

Number of generated scattering of flux is less than 10: ○
Number of generated scattering of flux is 10 or more: X (2) Evaluation of Viscosity Change
Continuous Measurement of Viscosity of Solder Paste
(a) Measurement Method The viscometer used for the measurement is PCU-205 manufactured by Malcom Co., Ltd. The viscosity was continuously measured for 8 hours under the test condition of rotation number of 10 rpm and measurement temperature of 25° C.

(b) Criteria of Judgement

If the viscosity after 8 hours was within the +20% of the initial viscosity, it was judged that the solder paste has an effect of suppression of viscosity increase (○). If the viscosity after 8 hours was exceed +20% of the initial viscosity, it was judged that the solder paste has no effect of suppression of viscosity increase (x).

(3) Evaluation of Solderability

Figure 2:
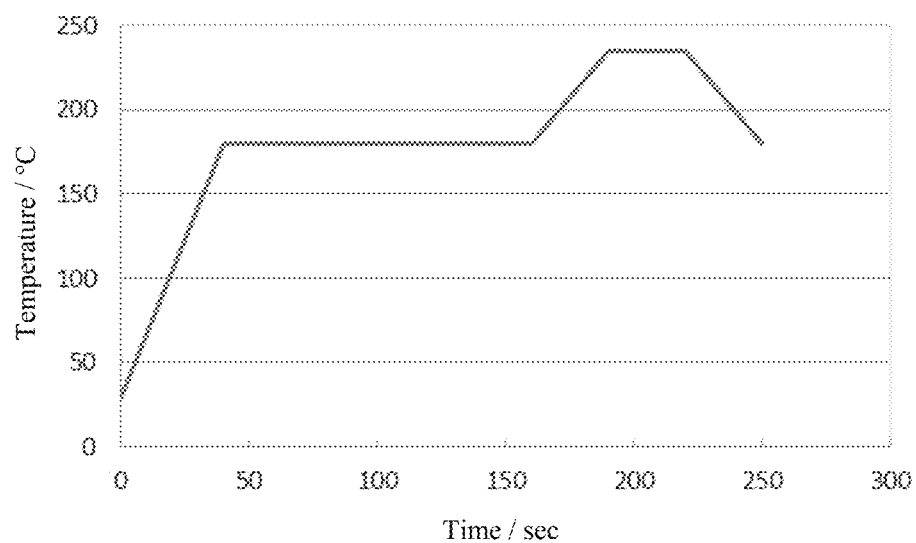
FIG. 2 is a graph illustrating a schematic diagram of a reflow profile in an evaluation test of solderability.

A solder paste composition was printed on a substrate using a metal mask having an opening diameter of 280 μm, number of openings of 64, mask thickness of 0.1 mm, and the substrate was subjected to reflow in an atmosphere using the reflow profile shown in FIG. 2 (preheat: 180° C. for 120 seconds, peak temperature: 235° C., melting time at 220° C. or more: 40 seconds) to melt a powder of a solder alloy. For the evaluation of solderability, if all of the printed 64 points melted, the solder paste composition was judged to be passed (○), if at least one of the printed 64 points did not melt, the solder paste composition was judged to be not passed (x).

TABLE 3

|  | Example 1 | Example 2 | Example 3 | Example 4 | Comparative Example 1 | Comparative Example 2 | Comparative Example 3 | Comparative Example 4 |
| --- | --- | --- | --- | --- | --- | --- | --- | --- |
| Scattering | ○ | ○ | ○ | ○ | X | ○ | X | X |
| Suppression of viscosity increase | ○ | ○ | ○ | ○ | X | ○ | ○ | X |
| Solderability | ○ | ○ | ○ | ○ | ○ | X | ○ | ○ |

As can be seen from the results of above Table 3, in Examples 1 to 4 using an anti-scattering agent (2,2'-methylenebis[6-(1-methylcyclohexyl)-p-cresol]) represented by formula (1), good results were obtained for all evaluations of scattering of flux, viscosity change and solderability. As for the solder paste compositions of Examples 1 to 4, it was found that the flux does not tend to scatter on substrates when being heated during reflow, and thus the flux does not tend to adhere to the neighboring electronic components during mounting. Furthermore, the solder paste compositions of Examples 1 to 4 have an excellent storage stability, and the viscosity of those solder paste compositions do not tend to increase over time, and thus the effect of suppression of viscosity increase was confirmed.

On the other hand, in Comparative Example 3 using an anti-oxidant (triethylene glycol-bis[3-(3-t-butyl-5-methyl-4- hydroxyphenyl) propionate]) without using an anti-scattering agent of Examples 1 to 4, good viscosity change and solderability were obtained but large amount of scattering of flux was observed.

In Comparative Example 4 without using an anti-scattering agent of Examples 1 to 4 nor an anti-oxidant, good solderability was obtained, but large amount of scattering of flux was observed. Furthermore, large viscosity change was observed and thus the effect of suppression of viscosity increase was not confirmed.

Furthermore, in Comparative Example 1 using an anti-scattering agent in a percentage by weight of less than 0.5 wt. % in the flux composition, solderability was evaluated to be good, but large amount of scattering of flux was observed. Furthermore, large viscosity change was observed and thus the effect of suppression of viscosity increase was not confirmed.

In addition, in Comparative Example 2 using an anti-scattering agent in a percentage by weight of more than 10 wt. % in the flux composition, scattering of flux and viscosity change were evaluated to be good, but solderability was evaluated to be poor.

The invention claimed is:

1. A flux composition comprising:
    2,2'-methylenebis[6-(1-methylcyclohexyl)-p-cresol] as an anti-scattering agent; and
    an acid-modified rosin,
    wherein the percentage by weight of the anti-scattering agent is 0.5 to 10 wt. % and the percentage by weight of the acid-modified rosin is 30 wt. % to 60 wt. %.

2. The flux composition according to claim 1, further comprising an activator, a thixotropic agent, and a solvent.

3. A solder paste composition comprising the flux composition according to claim 1 and a solder powder.

* * * * *